United States Patent
Hu et al.

(10) Patent No.: US 10,943,863 B2
(45) Date of Patent: Mar. 9, 2021

(54) TECHNIQUES TO IMPROVE RELIABILITY IN CU INTERCONNECTS USING CU INTERMETALLICS

(71) Applicant: International Business Machines Corporation, Armonk, NY (US)

(72) Inventors: Chao-Kun Hu, Somers, NY (US); Christian Lavoie, Pleasantville, NY (US); Stephen M. Rossnagel, Pleasantville, NY (US); Thomas M. Shaw, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/570,037

(22) Filed: Sep. 13, 2019

(65) Prior Publication Data

US 2020/0006227 A1    Jan. 2, 2020

Related U.S. Application Data

(63) Continuation of application No. 15/198,292, filed on Jun. 30, 2016, now Pat. No. 10,461,026.

(51) Int. Cl.
*H01L 23/48* (2006.01)
*H01L 23/52* (2006.01)
(Continued)

(52) U.S. Cl.
CPC .... *H01L 23/5226* (2013.01); *H01L 21/76802* (2013.01); *H01L 21/76843* (2013.01);
(Continued)

(58) Field of Classification Search
CPC ......... H01L 21/76802; H01L 21/76843; H01L 21/76864; H01L 21/76871;
(Continued)

(56) References Cited

U.S. PATENT DOCUMENTS

| 6,069,068 A | 5/2000 | Rathore et al. |
| 6,130,161 A | 10/2000 | Ashley et al. |

(Continued)

FOREIGN PATENT DOCUMENTS

| CN | 1350703 A | 5/2002 |
| CN | 101317261 A | 12/2008 |

(Continued)

OTHER PUBLICATIONS

List of IBM Patents or Applications Treated as Related (2 pages).

*Primary Examiner* — Kimberly N Rizkallah
*Assistant Examiner* — Dilinh P Nguyen
(74) *Attorney, Agent, or Firm* — Robert Sullivan; Michael J. Chang, LLC

(57) ABSTRACT

Techniques for improving reliability in Cu interconnects using Cu intermetallics are provided. In one aspect, a method of forming a Cu interconnect in a dielectric over a Cu line includes the steps of: forming at least one via in the dielectric over the Cu line; depositing a metal layer onto the dielectric and lining the via such that the metal layer is in contact with the Cu line at the bottom of the via, wherein the metal layer comprises at least one metal that can react with Cu to form a Cu intermetallic; annealing the metal layer and the Cu line under conditions sufficient to form a Cu intermetallic barrier at the bottom of the via; and plating Cu into the via to form the Cu interconnect, wherein the Cu interconnect is separated from the Cu line by the Cu intermetallic barrier. A device structure is also provided.

19 Claims, 4 Drawing Sheets

(51) Int. Cl.
*H01L 21/4763* (2006.01)
*H01L 21/44* (2006.01)
*H01L 23/522* (2006.01)
*H01L 21/768* (2006.01)
*H01L 23/532* (2006.01)

(52) U.S. Cl.
CPC .. *H01L 21/76849* (2013.01); *H01L 21/76856* (2013.01); *H01L 21/76858* (2013.01); *H01L 21/76864* (2013.01); *H01L 21/76871* (2013.01); *H01L 21/76879* (2013.01); *H01L 23/53238* (2013.01)

(58) Field of Classification Search
CPC ......... H01L 21/76879; H01L 23/53238; H01L 21/76841; H01L 23/53223; H01L 23/53266; H01L 23/53252; H01L 23/5226; H01L 23/5384; H01L 28/75; H01L 29/4941; H01L 29/4933; H01L 33/0037; H01L 41/0815
USPC ........ 257/751, 774; 438/627, 637, 639, 643, 438/653, 667, 668, 672, 675
See application file for complete search history.

(56) References Cited

U.S. PATENT DOCUMENTS

| | | | |
|---|---|---|---|
| 6,133,136 A | 10/2000 | Edelstein et al. | |
| 6,203,613 B1 | 3/2001 | Gates et al. | |
| 6,323,124 B1 * | 11/2001 | Leiphart | C23C 14/046 204/192.32 |
| 6,399,496 B1 | 6/2002 | Edelstein et al. | |
| 6,518,167 B1 | 2/2003 | You et al. | |
| 6,656,834 B1 | 12/2003 | Besser et al. | |
| 7,084,060 B1 | 8/2006 | Furukawa et al. | |
| 7,247,946 B2 | 7/2007 | Bruley et al. | |
| 7,405,453 B2 | 7/2008 | Shero et al. | |
| 7,655,555 B2 | 2/2010 | Faust et al. | |
| 7,884,475 B2 | 2/2011 | Gambino et al. | |
| 8,053,861 B2 | 11/2011 | Mountsier et al. | |
| 8,492,289 B2 | 7/2013 | Edelstein et al. | |
| 8,742,581 B2 | 6/2014 | Yang et al. | |
| 9,190,321 B2 | 11/2015 | Cabral, Jr. et al. | |
| 2008/0311739 A1 | 12/2008 | Besling et al. | |
| 2011/0045171 A1 | 2/2011 | McFeely et al. | |
| 2015/0111316 A1 * | 4/2015 | Koschinsky | H01L 23/53238 438/14 |
| 2016/0218033 A1 * | 7/2016 | Joshi | H01L 21/32134 |
| 2017/0170062 A1 | 6/2017 | Murray et al. | |

FOREIGN PATENT DOCUMENTS

| | | |
|---|---|---|
| CN | 102956546 A | 3/2013 |
| JP | H1145887 A | 2/1999 |
| JP | 2004531900 A | 10/2004 |
| JP | 2006229207 A | 8/2006 |

* cited by examiner

TECHNIQUES TO IMPROVE RELIABILITY IN CU INTERCONNECTS USING CU INTERMETALLICS

CROSS-REFERENCE TO RELATED APPLICATIONS

This application is a continuation of U.S. application Ser. No. 15/198,292 filed on Jun. 30, 2016, now U.S. Pat. No. 10,461,026, the contents of which are incorporated by reference herein.

FIELD OF THE INVENTION

The present invention relates to techniques for improving reliability in copper (Cu) interconnects, and more particularly, to using Cu intermetallics to form liners, electromigration (EM) barriers, and caps for Cu interconnects.

BACKGROUND OF THE INVENTION

The resistance of copper (Cu) lines increases as scaling continues in the back-end-of-line (BEOL). Resistance increases first simply because the lines are having a smaller cross-sectional area. Also contributing to the overall resistance, as metal surfaces in a line become closer and grains in the metal become smaller in narrower lines, an increase in scattering from grain boundaries and surfaces/interfaces further contribute to an additional increase in resistivity, thus highlighting the importance of controlling interface and grain boundaries scattering in scaled Cu line technology.

Concurrently, other problems arise as scaling continues. One problem is diffusion barrier integrity. Namely, as liner thickness is reduced, performance is not sufficient and metals can diffuse into the dielectric. Since liner thickness needs to be maintained, the volume of Cu in very narrow lines is limited. Another problem is electromigration or EM resistance. Namely, as line area is reduced, the current density increases. As a result, Cu atom migration can lead to breaks in the smallest lines. Therefore, defining good EM interfaces is important. Good bounded interface will also likely help for interface scattering. There is also a need for a cap to prevent EM at the top surface of the line. Yet another problem that arises with Cu line scaling is adhesion at the bottom of the vias. Good adhesion is required to prevent crack propagation during chip processing. A reduction in liner thickness at the bottom of vias does not help adhesion between levels.

Proposed solutions have included use of self-forming embedded diffusion barriers containing materials such as manganese (Mn), cobalt (Co) and/or ruthenium (Ru). See, for example, U.S. Pat. No. 9,190,321 issued to Cabral Jr. et al., entitled "Self-Forming Embedded Diffusion Barriers." See also U.S. Patent Application Publication Number 2011/0045171 by McFeely et al., entitled "Multi-Step Method to Selectively Deposit Ruthenium Layers of Arbitrary Thickness on Copper" and U.S. Pat. No. 7,884,475 issued to Gambino et al., entitled "Conductor Structure including Manganese Oxide Capping Layer." All of these solutions involve elements that are either fully soluble in Cu (e.g., Mn) or have very low solubility with no possible phase forming (e.g., Co, Ru, etc.)

Therefore, improved barriers, liners, and caps for Cu interconnects are needed especially for scaled applications.

SUMMARY OF THE INVENTION

The present invention provides techniques for improving reliability in copper (Cu) interconnects using Cu intermetallics to form liners, electromigration (EM) barriers, and caps for Cu interconnects. In one aspect of the invention, a method of forming a Cu interconnect in a dielectric over a Cu line is provided. The method includes the steps of: forming at least one via in the dielectric over the Cu line; depositing a metal layer onto the dielectric and lining the via such that the metal layer is in contact with the Cu line at the bottom of the via, wherein the metal layer includes at least one metal that can react with Cu to form a Cu intermetallic; annealing the metal layer and the Cu line under conditions sufficient to form a Cu intermetallic barrier at the bottom of the via; and plating Cu into the via to form the Cu interconnect, wherein the Cu interconnect is separated from the Cu line by the Cu intermetallic barrier.

In another aspect of the invention, another method of forming a Cu interconnect in a dielectric over a Cu line is provided. The method includes the steps of: forming at least one via in the dielectric over the Cu line; depositing a metal layer onto the dielectric and lining the via such that the metal layer is in contact with the Cu line at the bottom of the via, wherein the metal layer includes at least one metal that can react with Cu to form a Cu intermetallic; plating Cu into the via to form the Cu interconnect; and annealing the metal layer, the Cu interconnect, and the Cu line under conditions sufficient to form i) a Cu intermetallic barrier at the bottom of the via and ii) a Cu intermetallic liner on sidewalls of the via, wherein the Cu interconnect is separated from the Cu line by the Cu intermetallic barrier.

In yet another aspect of the invention, a device structure is provided. The device structure includes: a Cu line; a dielectric on the Cu line; a Cu interconnect formed in a via in the dielectric over the Cu line; and a Cu intermetallic barrier separating the Cu interconnect from the Cu line.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for using copper (Cu) intermetallics to form adhesion layers, liners, electromigration (EM) barriers, and caps for Cu interconnects. The term "intermetallics," as used herein, generally refers to an alloy containing two or more metallic elements, and optionally one or more non-metallic elements.

Several different embodiments will be presented herein. In a first exemplary embodiment, elements are used that form intermetallics to form one or more of: adhesion layers, liners, EM barrier and caps. Advantageously, the formation of intermetallics provides interfaces with very good adhesion; limits Cu EM at interfaces and allows for redundancy if EM voids form; provides EM blocking layer at bottom of via that also increases adhesion between levels and prevents both EM and crack propagation; and helps to prevent Cu diffusion.

In a second exemplary embodiment, the intermetallic phase is formed from a bilayer of Cu or Cu alloy (seed or seed and plate) and a thin layer of metal that contains an important fraction of nitrogen (N) in solution. As the intermetallic forms with the properties given above, the solution metal-nitrogen is concentrated in nitrogen until it forms a barrier nitride between the intermetallic and the dielectric. To further illustrate this concept of a solution metal-nitrogen, one can look at zirconium (Zr) and metal nitrides of Zr. Zirconium nitride (ZrN) can vary in composition from about 40 atomic percent (at %) to about 50 at % nitrogen (N). However, Zr itself can contain a fair amount of nitrogen in solution in the metal before it forms a metal nitride. For instance, at 500 degrees Celsius (° C.), alpha-Zr can take up to 20% nitrogen without structure changes in the metallic phase. So a metal-nitrogen solution with Zr and 20% nitrogen is not yet a metal nitride, but a metal with nitrogen in solution. Thus, the important fraction for Zr—N is about 20%. The important fraction varies from metal to metal. By way of example only, elements with high nitrogen solubility (e.g., above 5 at %) include, but are not limited to, Zr, titanium (Ti), and hafnium (Hf). This solubility will vary when metals are alloyed together and also increases with temperature.

In this scenario, adhesion from the barrier nitride to both the dielectric or bottom Cu is good. The process is self aligned through the use of wet etch, reactive ion etching (RIE) or chemical-mechanical polishing (CMP) (e.g., wet etch or RIE for the EM barrier at the bottom of the via or the cap on top of a line, and CMP for the sidewalls and via bottom).

In a third exemplary embodiment, the metal or metal-nitride layer is first deposited into a dual damascene trench. The sample is then annealed to form an intermetallic at the bottom of the via for EM barrier formation. A second anneal is then performed to increase (or introduce) nitrogen content into the barrier layer before reaction with the Cu seed/plated.

Figure 1:
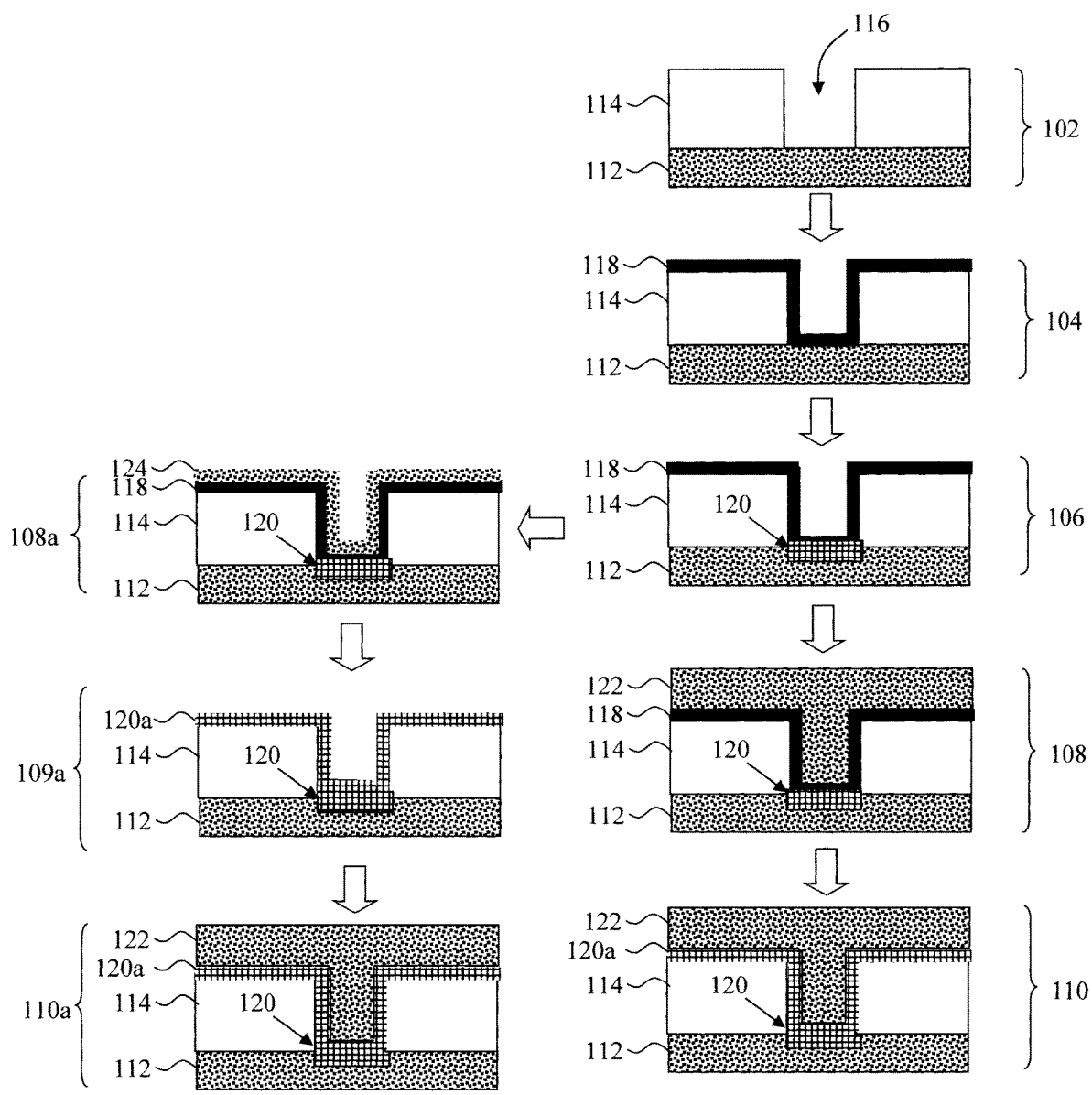
FIG. 1 is a schematic diagram illustrating an exemplary methodology for using copper (Cu) intermetallics to form adhesion layers, liners, and/or electromigration (EM) barriers according to an embodiment of the present invention.

Each of these exemplary embodiments will now be described in detail by way of reference to the following figures. FIG. 1, for example, illustrates an exemplary methodology 100 for using intermetallics (according to the first exemplary embodiment) to form one or more of: adhesion layers, liners, and EM barriers (cap formation will be described below).

The process begins in step 102 with a metal (e.g., Cu) line 112, a dielectric 114 on the metal line 112, and a via 116 having been formed in the dielectric 114 down to the metal line 112. The structure shown in step 102 is representative of a standard top metal layer in a back-end-of line (BEOL) metallization process. The via 116 may be formed using, e.g., a standard damascene process. The depiction of a single metal line 112 and/or a single via 116 in the figures is meant merely to illustrate the present techniques. The process described herein would apply in the same manner for processing multiple metal lines/vias.

In step 104, a metal layer 118 is next deposited onto the dielectric layer, lining the via 116. At the bottom of the via 116, the metal layer 118 is in contact with the metal line 112. The metal layer 118 contains a metal(s) that can react with Cu (i.e., so as to form an intermetallic/alloy). Optionally, the metal in layer 118 can be partially nitrided (i.e., as according to the second exemplary embodiment). An exemplary process flow including a partially nitride layer (for forming the intermetallics) is provided below. As highlighted above, the metal layer 118 can include any metal(s) that can react with Cu to form an intermetallic or alloy with Cu. Suitable metals include magnesium (Mg), calcium (Ca), strontium (Sr), barium (Ba), scandium (Sc), yttrium (Y), lutetium (Lu), cerium (Ce), titanium (Ti), zirconium (Zr), hafnium (Hf), zinc (Zn), cadmium (Cd), aluminum (Al), gallium (Ga), indium (In), silicon (Si), germanium (Ge), tin (Sn), phosphorous (P), arsenic (As), antimony (Sb), sulfur (S), selenium (Se), tellurium (Te), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), and/or ytterbium (Yb). All of these elements will form intermetallics with Cu and may be used in accordance with the present techniques.

It may however be advantageous to take some additional factors into consideration when selecting the particular metal(s) for forming the intermetallics. For example, solubility is one consideration. Solubility is an important factor since the goal is to have the Cu in the middle of the line be as conductive as possible. When elements move into the Cu, it raises its resistivity. Thus it is important to look at the solubility of any of the interested elements in Cu. If the solubility is high, then the formation of an intermetallic will raise the concentration of that element in the Cu up to the solubility limit. To use Cu—Zn versus Cu—Sc as an example, the solubility of Zn in Cu is significantly higher than the solubility of Sc in Cu (e.g., one can put more than 30% Zn in Cu, and almost no Sc in Cu). When an intermetallic is formed, the elements are in equilibrium with pure Cu in the middle of the line. For example, with regard to solubility, one may choose a metal(s) for layer 118 that have a solubility of less than about 0.5%. Of the above metals, those meeting this solubility requirement include, but are not limited to, the rare earth elements (i.e., Sc, Y, La, Ce, Pr, Nd, Pm, Sm, Eu, Gd, Tb, Dy, Ho, Er, Tm, Yb, and Lu), S, Se, Te, Ca, Ba, Sc, Lu, Zr, and/or Hf. One may also take lower resistivity into consideration and choose elements with resistivity lower than $50 \times 10^{-8}$ $\Omega$-m. For example, from the list of elements meeting the solubility requirements, elements such as Zr, Hf, Ti, and Yb also meet the resistance requirements, and thus may be preferred.

Next, in step 106, an anneal is performed under conditions sufficient to form a Cu intermetallic barrier layer 120 at the bottom of the via 116 on top of the metal line 112. The anneal can be performed using a variety of different annealing tools under varying conditions (i.e., temperatures and durations). By way of example only, using a standard annealing tool (such as rapid thermal annealing (RTA) or furnace). In that case, a temperature of from about 150° C. to about 400° C., and ranges therebetween, and a duration of from about 1 second to about 30 minutes, and ranges therebetween, may be employed. One may instead use a millisecond annealing tool (such as flash or laser annealing). In that case, a temperature of from about 300° C. to about 700° C., and ranges therebetween, and a duration of from about 1 millisecond to about 30 milliseconds, and ranges therebetween, may be employed. Further, one may also use a nanosecond annealing tool (such as an excimer laser tool). In that case, a temperature of from about 700° C. to about 1,200° C., and ranges therebetween, and a duration of from about 10 nanoseconds to about 100 nanoseconds, and ranges therebetween, may be employed. The anneal will react the Cu from metal line 112 with the metal in layer 118 to form the Cu intermetallic barrier layer 120. As shown in step 106, the Cu intermetallic barrier will form only in those regions where the metal layer 118 is in contact with the Cu, i.e., at the bottom of the via 116. It is notable that, if the goal is solely to produce an intermetallic barrier at the bottom of via 116, then the unreacted portions of metal layer 118 (i.e., those portions in contact with the dielectric 114) can now optionally be removed (not shown), and the process continued to fill the via with Cu as described below. Further, the anneal may (optionally) be performed in a nitrogen ambient which will lead to nitridation of the Cu intermetallic barrier layer 120, e.g., as per the second exemplary embodiment. This nitridation process will be described in further detail below.

Electromigration is the transport of material (e.g., Cu) that is caused by the movement of ions in a conductor due to momentum transfer between conducting electrons and diffusing metal atoms. As provided above, interconnect scaling leads to an increase in current density and hence an increase in EM. With increased EM, small Cu lines can break. An EM barrier can be used to prevent Cu from migrating out of the lines. In the present example, the Cu intermetallic 120 at the bottom of via 116 serves as an effective EM barrier.

If left in place, the remaining portions of the metal layer 118 can then be used to form a diffusion and EM liner along the sidewalls of the via 116. To do so, Cu is plated into the via 116 and then a second anneal is performed to form a Cu intermetallic barrier via the metal layer 118 and the plated Cu. Of course, if the remaining metal layer 118 was removed after the first annealing step, then no Cu intermetallic barrier will be formed on the sidewalls of the via 116. As is known in the art, Cu plating requires that a thin Cu seed layer be deposited first (e.g., using sputtering). This Cu seed layer can be formed from Cu or a Cu alloy with elements such as manganese (Mn).

Namely, in step 108 Cu 122 is plated into the via 116 and onto the metal layer 118 over the dielectric 114. To plate the Cu into the via, a Cu seed layer is first deposited onto the metal layer 118 lining the via 116. The Cu seed layer can be deposited using a process such as physical vapor deposition (PVD) or chemical vapor deposition (CVD). While not shown separately in step 108, it is notable that the Cu seed layer can have a same or different composition from the plated Cu 122. For instance, the Cu seed layer can be pure Cu or a Cu-alloy (such as a copper-manganese alloy). Cu 122 is then plated onto the Cu seed layer to form an interconnect structure (i.e., connecting the metal line 112 to one or more other wiring layers). Next, in step 110, an anneal is performed under conditions sufficient to form a Cu intermetallic liner 120a along the sidewalls of the via 116. Suitable annealing conditions (e.g., temperature and duration) were provided above and, as described above, can vary depending on the annealing tool being employed. The anneal will react Cu 122 with the metal in layer 118 to form the Cu intermetallic liner 120a. By way of the Cu intermetallic barrier layers 120 and liner 120a, a barrier is now fully formed separating the Cu 122 (interconnect structure) from the dielectric 114.

In the exemplary process flow presented immediately above, the seed layer was deposited followed by Cu plating, and then an anneal to form the Cu intermetallic barrier layer. Variations of this process can also be implemented. For instance, as shown in FIG. 1 one can first deposit the seed layer, then perform the anneal to form the Cu intermetallic barrier layers 120a, followed by plating the Cu 122 into the via 116. Specifically, in step 108a the Cu seed layer (pure Cu or Cu alloy—see above) 124 is first deposited on the metal layer 118, lining the via 116. In step 109a, an anneal is performed to react the Cu seed layer with the metal layer 118 to form the Cu intermetallic barrier layer 120a. Suitable conditions for the anneal were provided above. Then in step 110a, Cu 122 is plated into the via 116 to form the interconnect structure.

As highlighted above, in a second exemplary embodiment, nitride versions of the present Cu intermetallics are used. This embodiment is now described by way of reference to methodology 200 of FIG. 2. In step 202, the process begins in the same manner as in FIG. 1 with a metal (e.g., Cu) line 112, a dielectric 114 on the metal line 112, and a via 116 having been formed in the dielectric 114 down to the metal line 112.

Next, in step 204 a metal layer 212 is deposited onto the dielectric layer, lining the via 116. At the bottom of the via 116, the metal layer 212 is in contact with the metal line 112. The metal layer 212 is a metal from the above described metal(s) that can react with Cu (i.e., so as to form an intermetallic/alloy) and can contain at least a few atomic % of N in solution in the metal. Thus, if in the example provided above the metal is hafnium, then in this case a hafnium-nitrogen solution would be used. From the binary phase diagrams of the above list of suitable intermetallic metals with N, only a few of these metals can contain N in solution. Favorable metals to accept a large amount of nitrogen (N) in solution (>10 at %) can be identified as Ti, Zr and Hf. It is notable that most of the other metals in the list above do not take significant amount of N in solution in the metal. As many metal-N binary phase materials are not available today, it is possible that a few of the metals on the list of reacting elements with Cu join the list of metals that can take nitrogen in solution in the at % range.

Again, preferred candidates from this list may be selected based on additional criteria such as solubility and resistance. As will be described in detail below, use of these metal-nitrogen solutions has the added benefit of forming a barrier nitride (as part of a bilayer with the intermetallics) between the Cu interconnect and the dielectric after the system is annealed to a temperature sufficient to form the intermetallics.

Next, in step 206, an anneal is performed under conditions sufficient to form a Cu intermetallic barrier layer 214 at the bottom of the via 116 on top of the metal line 112. The anneal will react the Cu from metal line 112 with the nitrogen containing metal in layer 212 to form the Cu intermetallic barrier layer 214. As shown in step 206, the Cu intermetallic barrier will form only in those regions where the metal layer 212 is in contact with the Cu, i.e., at the bottom of the via 116. As also shown in step 206, the metal-Cu reaction (i.e., at the bottom of the via 116) will increase the nitride concentration in that portion of the metal layer 212. Namely, as provided above, the nitrogen N is in solution. Thus, when the metal reacts with the Cu, the intermetallic is formed at the interface with the Cu and the nitrogen becomes more concentrated on the metal side until the nitride barrier compound forms. The concentration of nitrogen in the metal layer can be anywhere below the solubility limit and, after reaction, the N concentration will represent the concentration in the nitride of that particular metal. The nitrogen concentration in the metal layer 212, goes from below the solubility limit in the metal to that of the nitride of the same metal as we consume some of the metal to form the Cu intermetallic.

Figure 2:
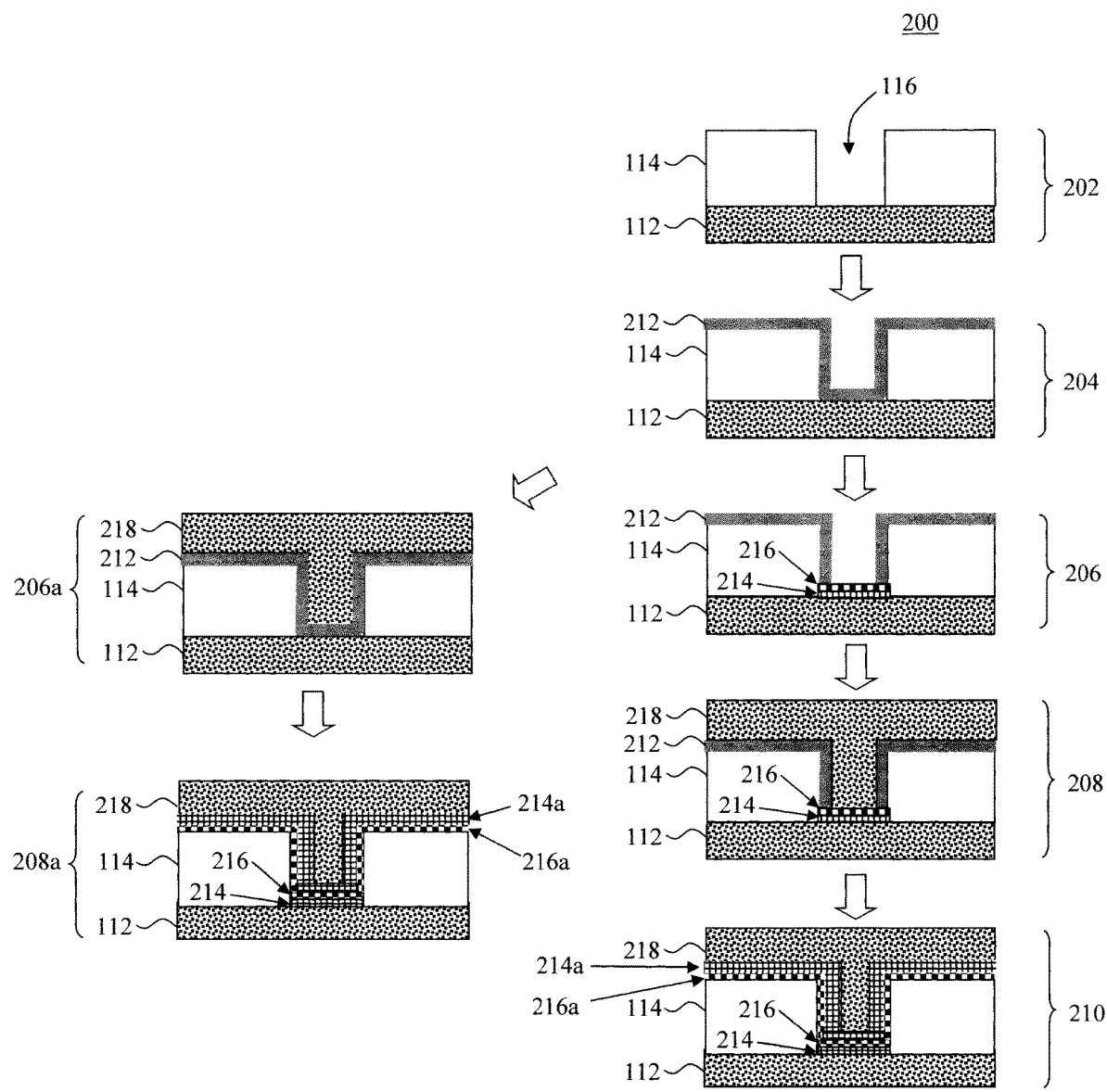
FIG. 2 is a schematic diagram illustrating an exemplary methodology forming a Cu intermetallic/barrier nitride bilayer according to an embodiment of the present invention.

As a result, instead of forming only an intermetallic barrier layer at the bottom of the via 116 (as in the first exemplary embodiment above), here a bilayer structure is formed. As shown in FIG. 2, one layer of the bilayer structure adjacent to the metal line 112 is the Cu intermetallic barrier layer 214. Another layer of the bilayer structure adjacent to the Cu intermetallic barrier layer 214 is a portion of the metal layer 212 having concentrated nitrogen. This portion of the metal layer 212 having concentrated nitrogen forms a barrier nitride 216 between the interconnect structure and the dielectric 114.

The same processing conditions (e.g., temperature, duration, etc.) provided above for performing the anneal can be implemented here as well (which, as provided above, can vary depending on the annealing tool being implemented). As provided above, it is notable that if a nitrogen ambient is used during the anneal in the first exemplary process flow, then the result will be the formation of this bilayer (intermetallic nitride barrier layer) configuration. Thus, to form the bilayer structure one may start with a nitrogen-metal solution, or implement an anneal of the metal layer/Cu in a nitrogen ambient. As provided above, the Cu intermetallic layer 214 serves as an EM and diffusion barrier. The added nitride barrier in this embodiment provides an additional barrier for Cu diffusion.

The remaining portions of the metal layer 212 can then be used to form the bilayer liner (e.g., a Cu intermetallic layer 214a and barrier nitride 216a) along the sidewalls of the via 116. To do so, Cu is plated into the via 116 and then a second anneal is performed to form a Cu intermetallic/nitride bilayer liner via the metal layer 212 and the plated Cu in the same manner as described above.

Namely, in step 208 Cu 218 is plated into the via 116 and onto the (metal-nitrogen solution) metal layer 212 over the dielectric 114. To plate the Cu into the via, a Cu seed layer is first deposited (e.g., using PVD, CVD, etc.) onto the metal layer 212 lining the via 116. While not shown separately in step 208, it is notable that the Cu seed layer can have a same or different composition from the plated Cu 218. For instance, the Cu seed layer can be pure Cu or a Cu-alloy (such as a copper-manganese alloy). Cu 218 is then plated onto the Cu seed layer to form an interconnect structure (i.e., connecting the metal line 112 to one or more other wiring layers). Next, in step 210, an anneal is performed under conditions sufficient to form the bilayer containing a Cu intermetallic barrier layer 214a and a barrier nitride 216a along the sidewalls of the via 116. According to an exemplary embodiment, the same annealing conditions, e.g., temperature, duration, etc. (as above) are used (which, as provided above, can vary depending on the annealing tool being implemented). The anneal will react Cu 218 with the metal-nitrogen solution in layer 212 to form the Cu intermetallic barrier layer 214a while the metal-nitrogen solution becomes concentrated in a portion of the metal layer 212 separating the Cu intermetallic barrier layer 214/214a from the dielectric 114.

As a further variation, it is also possible to fill all of the materials (i.e., the metal layer 212, Cu seed layer/plated Cu 218, etc.) into the via 116, and then perform the anneal to form the Cu intermetallic barrier layer 214/barrier nitride 216 at the bottom of the via 116 and Cu intermetallic barrier layer 214a/barrier nitride 216a along the sidewalls of the via 116. See alternative steps 206a and 206b. The same processes as described above are performed, except that a single anneal is performed at the end rather than before and after the Cu plating. Namely, as shown in step 206a, the metal layer 212 is first deposited onto the dielectric layer, lining the via 116. Via 116 is then filled with Cu seed layer (not shown)/plated Cu 218. As shown in step 208a, anneal is then performed in the same manner as described above to form the Cu intermetallic barrier layer 214/barrier nitride 216 at the bottom of the via 116 and Cu intermetallic barrier layer 214a/barrier nitride 216a along the sidewalls of the via 116.

As provided above, it is notable that the reaction anneal to form the Cu intermetallic barrier layer can instead be performed after deposition of the Cu seed layer, but before Cu 218 is plated into the via 116. The specific sequence of these steps is shown illustrated in FIG. 1. The only difference here is that the metal layer contains a metal nitride, and as a result a bilayer Cu intermetallic and barrier nitride will be formed.

As highlighted above, in a third exemplary embodiment, nitridation during the annealing steps (e.g., via a nitride ambient) can be used to introduce or increase the nitrogen concentration in the metal or metal nitride barrier layer. For instance, in the scenario shown illustrated in FIG. 2, an anneal in a nitrogen ambient can be used to increase the nitrogen concentration in the barrier nitride 216/216a. By contrast, in the example depicted in FIG. 1, an anneal in a nitrogen ambient can serve to introduce nitrogen to the metal layer 118 thereby forming a bilayer Cu intermetallic/barrier nitride.

As the above description highlights, a variety of different process flows are anticipated herein. To summarize, the following scenarios were presented above: (1) Metal or metal-nitrogen deposition/anneal (in N2 or not . . . )/Cu seed and plate; (2) Metal or metal-nitrogen deposition/Cu seed/ Anneal (in N2 or not . . . )/Cu plate; and (3) Metal or metal-nitrogen deposition/Cu seed and plate/anneal (in N2 or not . . . ).

The above-described process can also be used to form Cu intermetallic caps on Cu interconnect structures. See FIG. 3, described below. Further, when a metal nitride is used, a bilayer Cu intermetallic/barrier nitride cap is formed. See FIG. 4, described below. These capping processes can be employed in conjunction with the process flows described above to form barrier, liner, and caps for the present Cu interconnect structures.

Figure 3:
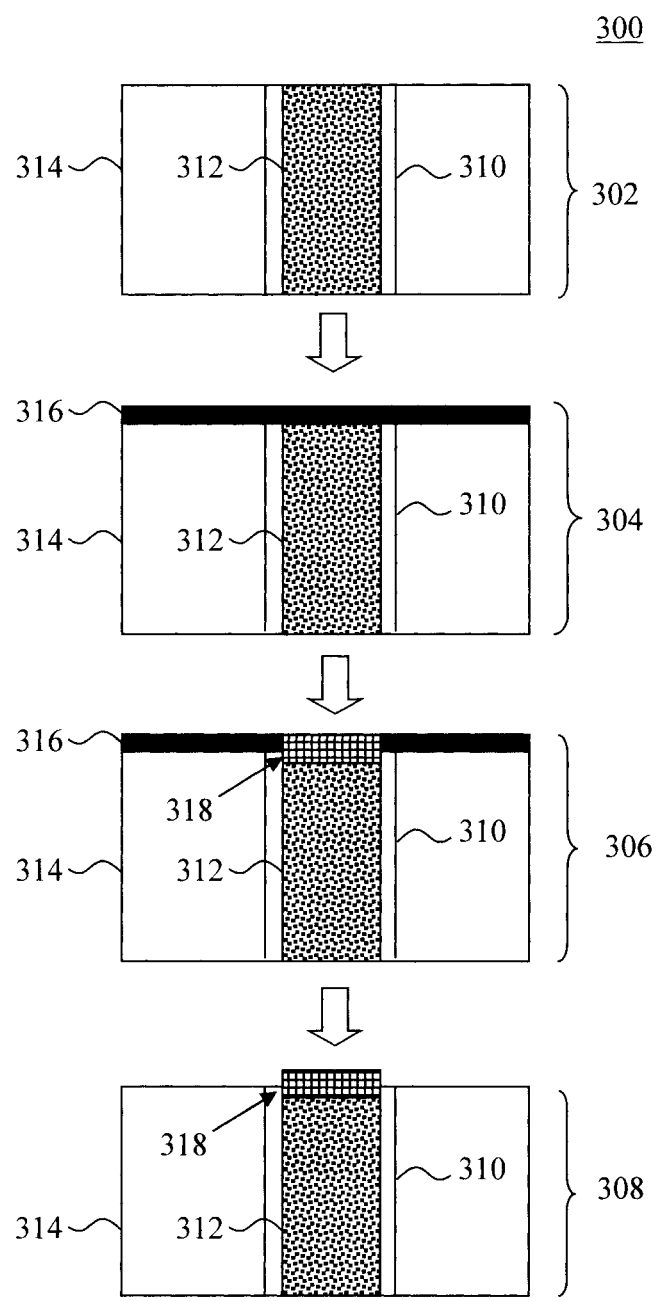
FIG. 3 is a schematic diagram illustrating an exemplary methodology forming a Cu intermetallic capping layer according to an embodiment of the present invention.

Referring to methodology 300 of FIG. 3, the process begins in step 302 with a Cu interconnect 312 having been formed in a dielectric 314. This Cu interconnect preferably includes thin liners and adhesion layers (represented generically as layer 310) on sidewall and bottom of the line. In step 304, a metal capping layer 316 is deposited onto the dielectric layer, covering (and in contact with) the top of the Cu interconnect 312. The metal capping layer 316 contains a metal that can react with Cu (i.e., so as to form an intermetallic/alloy). Suitable metals were provided above. Again, preferred candidates from this list may be selected based on additional criteria such as solubility and resistance.

Next, in step 306, an anneal is performed under conditions sufficient to form a Cu intermetallic capping layer 318 on the top of the Cu interconnect 312. The anneal will react the Cu from Cu interconnect 312 with the metal in layer 316 to form the Cu intermetallic capping layer 318. As shown in step 306, the Cu intermetallic capping layer will form only in those regions where the metal capping layer 316 is in contact with the Cu interconnect 312. The same processing conditions (temperature, duration, etc.) provided above for performing the anneal can be implemented here as well (which, as provided above, can vary depending on the annealing tool being implemented).

In step 308, unreacted portions of the metal capping layer 316 are removed. According to an exemplary embodiment, the unreacted portions of the metal layer 316 are removed using a wet etch or reactive ion etching (RIE). It is notable that the reaction front (of the Cu intermetallic) moves into the Cu. Thus, as shown in FIG. 3, the Cu intermetallic capping layer is at least partially below the dielectric 314. Thus, according to another exemplary embodiment, chemical-mechanical polishing (CMP) is used to polish the Cu intermetallic capping layer down to the surface of the dielectric 314, and thus effectively removing the excess metal.

Figure 4:
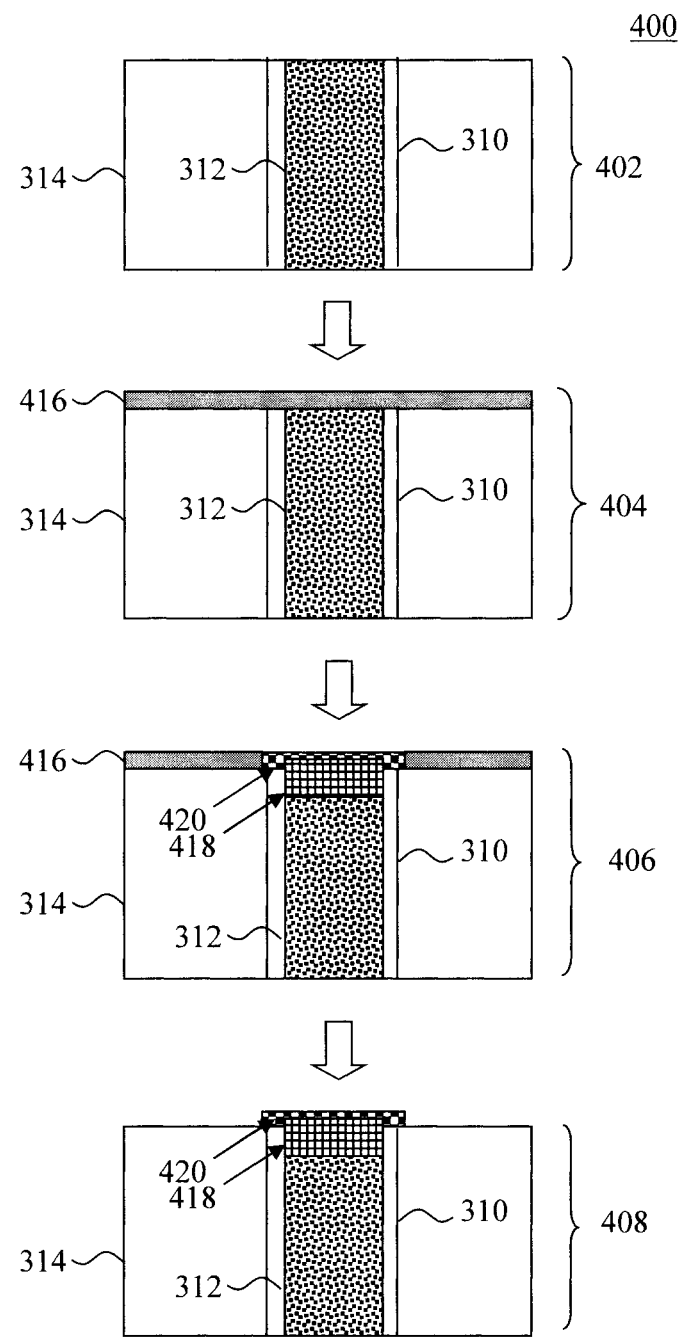
FIG. 4 is a schematic diagram illustrating an exemplary methodology forming a Cu intermetallic/barrier nitride bilayer capping layer according to an embodiment of the present invention.

The present process can also be used in the same general manner to form a capping layer using a bilayer Cu intermetallic/barrier nitride configuration in conjunction with the deposition of a metal-nitrogen solution. See methodology 400 of FIG. 4. Referring to FIG. 4, the process begins in the same manner in step 402 with a Cu interconnect 312 having been formed in a dielectric 314. In step 404, a metal nitride capping layer 416 is deposited onto the dielectric 314, covering (and in contact with) the top of the Cu interconnect 312. The metal nitride capping layer 416 contains a metal that can react with Cu (i.e., so as to form an intermetallic/alloy). Suitable metal-nitrogen solutions were provided above. Again, preferred candidates from this list may be selected based on additional criteria such as solubility and resistance.

Next, in step 406, an anneal is performed under conditions sufficient to form a bilayer Cu intermetallic capping layer 418/nitride capping layer 420 on top of the Cu interconnect 312. The same processing conditions (e.g., temperature, duration, etc.) provided above for performing the anneal can be implemented here as well.

In step 408, unreacted portions of the metal capping layer 416 are removed. According to an exemplary embodiment, the unreacted portions of the metal layer 416 are removed using a wet etch or RIE, or a polishing process such as chemical mechanical polishing (CMP).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a copper (Cu) interconnect in a dielectric over a Cu line, the method comprising the steps of:
    forming at least one via in the dielectric over the Cu line;
    depositing a metal layer onto the dielectric and lining the via such that the metal layer is in contact with the Cu line at the bottom of the via, wherein the metal layer comprises at least one metal that can react with Cu to form a Cu intermetallic;
    plating Cu into the via to form the Cu interconnect; and
    annealing the metal layer, the Cu interconnect, and the Cu line under conditions sufficient to form i) a Cu intermetallic barrier and a nitride barrier at the bottom of the via and ii) a Cu intermetallic liner and a nitride liner on sidewalls of the via, wherein the Cu interconnect is separated from the Cu line by the Cu intermetallic barrier and the nitride barrier, wherein the Cu intermetallic barrier is present between the nitride barrier and the Cu line at the bottom of the via, and wherein the nitride liner is present between the Cu intermetallic liner and the dielectric along the sidewalls of the via.

2. The method of claim 1, wherein the conditions comprise a temperature of from about 150° C. to about 400° C. and ranges therebetween.

3. The method of claim 2, wherein the conditions comprise a duration of from about 1 second to about 30 minutes.

4. The method of claim 1, wherein the conditions comprise a temperature of from about 300° C. to about 700° C. and ranges therebetween.

5. The method of claim 4, wherein the conditions comprise a duration of from about 1 millisecond to about 30 milliseconds.

6. The method of claim 1, wherein the conditions comprise a temperature of from about 700° C. to about 1,200° C. and ranges therebetween.

7. The method of claim 6, wherein the conditions comprise a duration of from about 10 nanoseconds to about 100 nanoseconds.

8. The method of claim 1, further comprising the step of:
    depositing a Cu seed layer into and lining the via.

9. The method of claim 8, wherein the Cu seed layer comprises pure Cu.

10. The method of claim 8, wherein the Cu seed layer comprises a copper-manganese alloy.

11. The method of claim 8, wherein the Cu seed layer has a same composition as the Cu interconnect.

12. The method of claim 8, wherein the Cu seed layer has a different composition from the Cu interconnect.

13. The method of claim 1, wherein the annealing is performed in a nitrogen ambient.

14. The method of claim 1, wherein the metal layer comprises a metal that can contain above 5 at % atomic percent of nitrogen in solution.

15. The method of claim 14, wherein the metal layer comprises a metal selected from the group consisting of: zirconium, hafnium, titanium, and combinations thereof.

16. The method of claim 1, wherein the Cu is plated into the via over the metal layer to form the Cu interconnect.

17. A method of forming a Cu interconnect in a dielectric over a Cu line, the method comprising the steps of:
    forming at least one via in the dielectric over the Cu line;
    depositing a metal layer onto the dielectric and lining the via such that the metal layer is in contact with the Cu line at the bottom of the via, wherein the metal layer comprises at least one metal that can react with Cu to form a Cu intermetallic, and wherein the metal layer comprises a metal selected from the group consisting of: titanium, zirconium, hafnium, and combinations thereof;
    depositing a Cu seed layer into and lining the via;
    plating Cu into the via to form the Cu interconnect; and
    annealing the metal layer, the Cu interconnect, and the Cu line under conditions sufficient to form i) a Cu intermetallic barrier and a nitride barrier at the bottom of the via and ii) a Cu intermetallic liner and a nitride liner on sidewalls of the via, wherein the Cu interconnect is separated from the Cu line by the Cu intermetallic barrier and the nitride barrier, wherein the Cu intermetallic barrier is present between the nitride barrier and the Cu line at the bottom of the via, and wherein the nitride liner is present between the Cu intermetallic liner and the dielectric along the sidewalls of the via.

18. The method of claim 17, wherein the annealing is performed in a nitrogen ambient.

19. The method of claim 17, wherein the metal layer comprises a metal that can contain above 5% atomic percent of nitrogen in solution.

* * * * *